US008539969B2

(12) United States Patent
Rastegar

(10) Patent No.: US 8,539,969 B2
(45) Date of Patent: Sep. 24, 2013

(54) GIGASONIC BRUSH FOR CLEANING SURFACES

(75) Inventor: Abbas Rastegar, Schenectady, NY (US)

(73) Assignee: Sematech, Inc., Albany, NY (US)

(*) Notice: Subject to any disclaimer, the term of this patent is extended or adjusted under 35 U.S.C. 154(b) by 0 days.

(21) Appl. No.: 12/847,621

(22) Filed: Jul. 30, 2010

(65) Prior Publication Data
US 2012/0024313 A1    Feb. 2, 2012

(51) Int. Cl.
*B08B 3/12* (2006.01)
(52) U.S. Cl.
USPC ............................ 134/184; 134/186; 134/902
(58) Field of Classification Search
USPC ........................................ 134/184, 186, 902
See application file for complete search history.

(56) References Cited

U.S. PATENT DOCUMENTS

| | | | | |
|---|---|---|---|---|
| 4,178,188 | A * | 12/1979 | Dussault et al. | 134/1 |
| 5,164,920 | A * | 11/1992 | Bast et al. | 367/140 |
| 5,241,209 | A * | 8/1993 | Sasaki | 257/416 |
| 5,562,778 | A * | 10/1996 | Koretsky et al. | 134/1 |
| 6,021,789 | A * | 2/2000 | Akatsu et al. | 134/57 R |
| 6,090,205 | A * | 7/2000 | Sakai et al. | 118/500 |
| 6,098,643 | A * | 8/2000 | Miranda | 134/186 |
| 6,230,722 | B1 * | 5/2001 | Mitsumori et al. | 134/122 R |
| 6,554,003 | B1 * | 4/2003 | Birang et al. | 134/1.3 |
| 6,588,437 | B1 * | 7/2003 | Higashi | 134/148 |
| 7,191,787 | B1 * | 3/2007 | Redeker et al. | 134/184 |
| 7,247,977 | B2 * | 7/2007 | Goodson | 310/334 |
| 7,389,783 | B2 * | 6/2008 | Woods et al. | 134/148 |
| 2001/0032657 | A1 * | 10/2001 | Itzkowitz | 134/1.3 |
| 2002/0096578 | A1 * | 7/2002 | Al-Jiboory | 239/102.1 |
| 2002/0108631 | A1 | 8/2002 | Madanshetty | 134/1 |
| 2006/0151014 | A1 * | 7/2006 | Obweger et al. | 134/94.1 |
| 2010/0055920 | A1 * | 3/2010 | Peng | 438/710 |

FOREIGN PATENT DOCUMENTS

| | | | |
|---|---|---|---|
| JP | 09-330896 | * | 12/1997 |
| JP | 2000-021840 | * | 1/2000 |
| JP | 2005-131602 | * | 5/2005 |

OTHER PUBLICATIONS

Brereton and Bruno, "Particle removal by focused ultrasound," Journal of Sound and Vibration 173, 683(1990).
M. H. Schuck 1990, M.S. Thesis, The University of Michigan, .Removal of submicron contaminants from silicon wafers using focused acoustic waves.
International Search Report and Written Opinion issued in PCT/US2011/045761, dated May 31, 2012.

* cited by examiner

*Primary Examiner* — Michael Kornakov
*Assistant Examiner* — David Cormier
(74) *Attorney, Agent, or Firm* — Fulbright & Jaworski, LLP

(57) ABSTRACT

An apparatus, system, and method for a Gigasonic Brush for cleaning surfaces is presented. One embodiment of the system includes an array of acoustic transducers coupled to a substrate where the individual acoustic transducers have sizes in the range of 9 um2 to 250,000 um2. The system may include a positioning mechanism coupled to at least one of a target surface or the array of acoustic transducers, and configured to position the array of acoustic transducers within 1 millimeter of a target surface. The system may also include a cleaning liquid supply arranged to provide cleaning liquid for coupling the array of acoustic transducers to the target surface. The system may further include a controller coupled to the array of acoustic transducers and configured to activate the array of acoustic transducers.

20 Claims, 11 Drawing Sheets

GIGASONIC BRUSH FOR CLEANING SURFACES

BACKGROUND OF THE INVENTION

1. Field of the Invention

This invention relates generally to semiconductors and more particularly relates to an apparatus, system, and method for cleaning surfaces involved in semiconductor manufacturing.

2. Description of the Related Art

In semiconductor manufacturing, cleanliness is desired in order to improve the yield of acceptable semiconductor chips made during the manufacturing process. Previously, particles have been removed by exposing them to an acoustic wave in a liquid media is through cavitation. An active acoustic transducer can cause cavitation, and the collapse of cavitation bubbles create surface jet flows that dislodge particles.

Megasonic cleaners that utilize cavitation by generating acoustic waves with frequencies in the range of 0.5 to 3.0 MHz have been used for removing particles with diameters larger than 500 nanometers from surfaces. Particle removal efficiency increases as the frequency of acoustic waves increases. Particle removal efficiency also increases with acoustic power density. Typically, large acoustic transducers, for example 10 millimeters on an edge, have been used to create sufficient acoustic power densities. But since typical transducer materials have resonant frequencies inversely proportional to size, the frequency range of large transducers and the particle removal efficiency of megasonic cleaners have been limited. Thus, the ability of megasonic cleaners to safely remove particles smaller than 500 nanometers with high resonant frequencies has also been limited.

The referenced shortcomings are not intended to be exhaustive, but rather are among many that tend to impair the effectiveness of previously known techniques concerning particle removal from surfaces in semiconductor manufacturing processes; however, those mentioned here are sufficient to demonstrate that the methodologies appearing in the art have not been satisfactory and that a significant need exists for the techniques described and claimed in this disclosure.

SUMMARY OF THE INVENTION

From the foregoing discussion, it should be apparent that a need exists for a system, apparatus, and method for cleaning nanometer range particles from surfaces.

A system is presented for safely removing particles from surfaces. In one embodiment the system includes an array of acoustic transducers coupled to a substrate where the individual acoustic transducers have sizes in the range of 9 square micrometers to 250,000 square micrometers. The system may include a positioning mechanism coupled to at least one of a target surface and the array of acoustic transducers, and configured to position the array of acoustic transducers within 1 millimeter of the target surface. The system may also include a cleaning liquid supply arranged to provide cleaning liquid for coupling the array of acoustic transducers to the target surface. The system may further include a controller coupled to the array of acoustic transducers and configured to activate the array of acoustic transducers.

In certain embodiments, the array of acoustic transducers further configured to directly excite a particle having a diameter in the range of 1 nanometer to 500 nanometers on the target surface with acoustic waves at one or more frequencies in the range of 10 Megahertz to 10 Gigahertz from the array of acoustic transducers.

Further embodiments may include a substrate having a concave surface, the array of acoustic transducers being coupled to the concave substrate to focus the acoustic waves from the array of acoustic transducers on a point. Other embodiments may include a substrate having a semi-cylindrical surface, the array of acoustic transducers being coupled to the semi-cylindrical substrate to focus the acoustic waves from the array of acoustic transducers on a line. The array of acoustic transducers being coupled to a two-dimensional plane on a substrate.

In certain embodiments, the array of acoustic transducers may include a first group of acoustic transducers configured to operate at a first frequency and a second group of acoustic transducers configured to operate at a second frequency. The first group of acoustic transducers and the second group of acoustic transducers being intermixed.

In certain embodiments, the controller may further include a first switch, coupled to a first acoustic transducer and configured to selectively activate the first acoustic transducer, and a second switch, coupled to a second transducer and configured to selectively activate the second acoustic transducer.

An apparatus is also presented for removing particles from surfaces. In one described embodiment, the apparatus includes a substrate, an array of acoustic transducers coupled to the substrate, where the acoustic transducers have sizes in the range of 9 square micrometer to 250,000 square micrometer, and a cleaning liquid supply arranged to provide cleaning liquid for coupling the array of acoustic transducers to the target surface. The array of acoustic transducers may be configured to directly excite a particle having a diameter in the range of 1 nanometer to 500 nanometers on the target surface with acoustic waves at one or more frequencies in the range of 10 megahertz to 10 gigahertz from the array of acoustic transducers.

In a further embodiment, the array of acoustic transducers may include a first group of acoustic transducers configured to operate at a first frequency and a second group of acoustic transducers configured to operate at a second frequency. The first group of acoustic transducers and the second group of acoustic transducers may be intermixed.

In certain embodiments, the first acoustic transducer is configured for selective activation and a second acoustic transducer is configured for selective activation.

A method is also presented for removing particles from a surface. The method in the disclosed embodiments substantially includes the steps necessary to carry out the functions presented above with respect to the operation of the described apparatus and system. In one embodiment, the method includes providing an array of acoustic transducers where individual transducers have sizes in the range of 9 um2 to 250,000 um2, positioning the array of acoustic transducers within 1 millimeter of a target surface, coupling the array of acoustic transducers to the target surface via a cleaning liquid, and directly exciting a particle having a diameter in the range of 1 nanometer to 500 nanometers on the target surface with acoustic waves at one or more frequencies in the range of 10 megahertz to 10 gigahertz from the array of acoustic transducers.

Certain embodiments may include focusing the acoustic waves from the array of acoustic transducers on a point. Other embodiments may include focusing the acoustic waves from the array of acoustic transducers on a line. Further embodiments may include coupling the array of acoustic transducers to a two-dimensional plane.

Another described apparatus includes a low frequency acoustic transducer configured to operate within a first acoustic frequency range, an array of high frequency acoustic transducers coupled to the low frequency acoustic transducers, the high frequency acoustic transducers configured to operate within a second acoustic frequency range, where the second acoustic frequency range is higher than the first acoustic frequency range, and a cleaning liquid supply arranged to provide a cleaning liquid to couple the array of acoustic transducers to a target surface.

In one embodiment, the first frequency range is 500 kHz to 10 MHz. In such an embodiment, the high frequency transducers have sizes in the range of 9 square micrometers to 250,000 square micrometers. In one embodiment, the second frequency range is 10 MHz to 10 GHz. In such an embodiment, the low frequency transducer has a physical diameter of between 5 mm and 300 mm. The low frequency transducer may also have a physical thickness of between 500 µm to 10 mm.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

The term "concave" is used to describe an inwardly curved shape. A cross-section profile of the inward curve may be defined by a portion of an circle, a portion of an ellipse, a portion of a parabola, a portion of a hyperbola, or a portion of other curved geometric shapes.

The term "semi-cylindrical" is used to describe an inwardly curved shape along a line. A cross-section profile of the inward curve may be defined by a portion of a circle, a portion of an ellipse, a portion of a parabola, a portion of a hyperbola, or portions of other curved geometric shapes.

The term "diameter" is used to describe a the size of a particle on a target surface. The term is not limited to describing a round or circular particle. The diameter of a particle may the distance from one point on the particle to a second point on the particle where the points are on substantially opposite sides of the particle.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1:
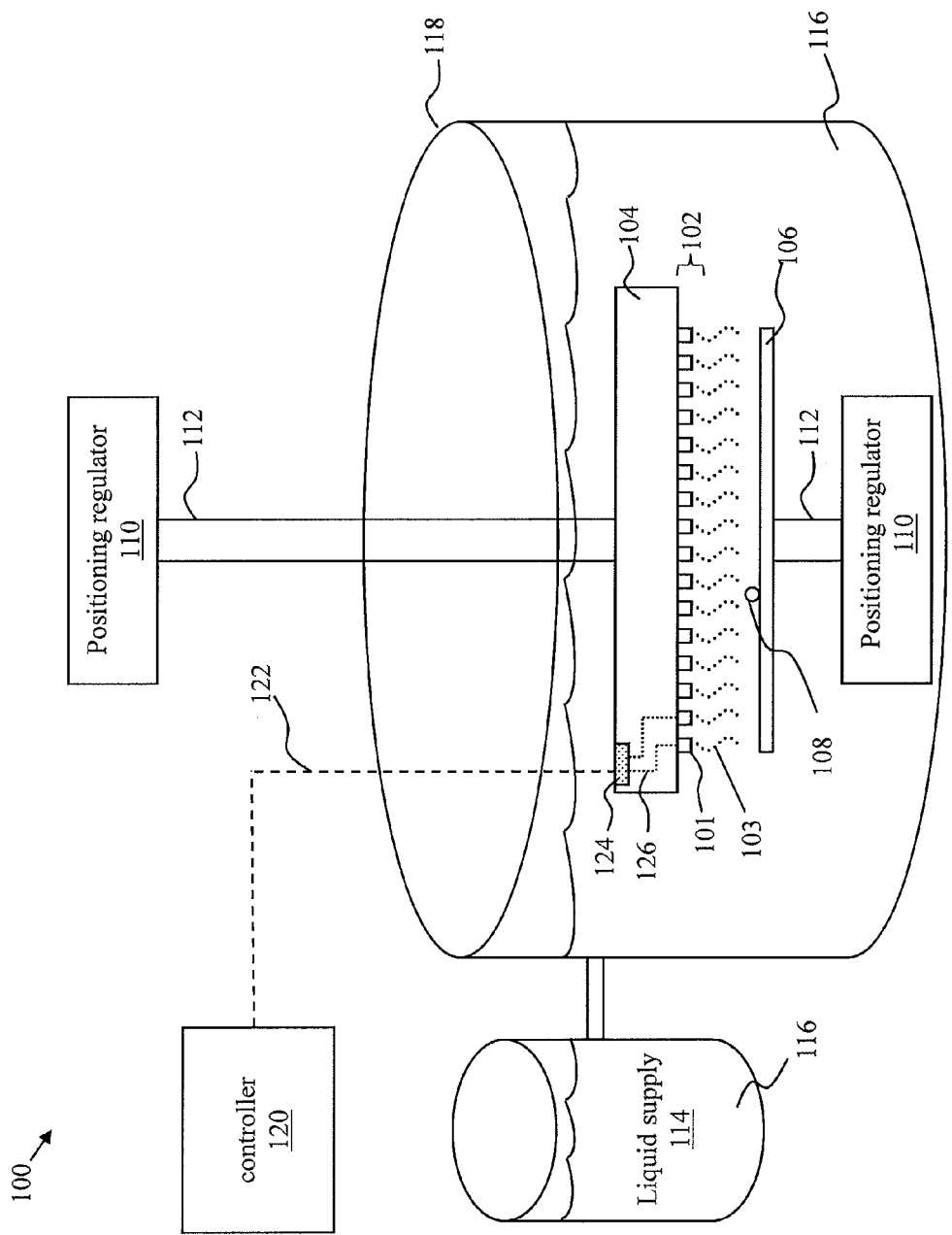
FIG. 1 is a schematic block diagram illustrating one embodiment of a system for removing particles from a surface.

FIG. 1 describes one embodiment of a system 100 for cleaning surfaces with a gigasonic brush. The system 100 may include an array 102 of acoustic transducers 101 which includes individual acoustic transducers 101 having sizes in the range of 9 µm2 to 250,000 µm2. In one embodiment, the resonant frequency of an acoustic transducer 101 is inversely proportional to the size of the acoustic transducer 101. The size of acoustic transducers 101, and the material that comprises the acoustic transducers 101 may cause the array 102 of acoustic transducers 101 to emit acoustic waves 103 with frequencies in the range of 10 megahertz to 10 gigahertz. Unlike megasonic systems that only utilize cavitation, the system 100 for generating acoustic waves 103 in the frequency range of 10 megahertz to 10 gigahertz may remove a particle 108 having a diameter in the range of 1 nanometer to 500 nanometers through direct excitation of the particle 108. The acoustic transducers 101 may generate acoustic waves 103 at or around the resonant frequency of a particle 108, directly exciting the particle 108, and causing the particle 108 to dislodge from the target surface 106. In alternative embodiments, the disclosed system 100 may cause direct excitation alone to remove particles, or it may cause direct excitation in conjunction with other mechanisms, such as cavitation, for particle removal.

As illustrated in FIG. 1, the system 100 may include an array 102 of acoustic transducers 101 coupled to a substrate 104. Though the diagram in FIG. 1 is not to scale, the array 102 of acoustic transducers 101 may be positioned close to a target surface 106. The system 100 may include a supply 114 of cleaning liquid 116 and a tank 118. The tank 118 may hold the cleaning liquid 116 that couples the array 102 of acoustic transducers 101 to the target surface 106 and the particle 108. A positioning mechanism 112 may be coupled to at least one of the array 102 of acoustic transducers 101 and the target surface 106. A positioning regulator 110 may control the positioning mechanism 112 and set the position of the array 102 of acoustic transducers 101 relative to the target surface 106. A controller 120 may activate and deactivate the array 102 of acoustic transducers 101 by sending a signal, or applying a voltage. In one embodiment, the controller 120 may be coupled to a signal bus 122. An interface 124 on the substrate 104 may couple the signal bus 122 to the internal routing 126 which is coupled to the acoustic transducers 101.

In semiconductor manufacturing, cleanliness is desired in order to improve the yield of acceptable semiconductor chips made during the manufacturing process. In certain embodiments, the target surface 106 may be a semiconductor wafer. In alternative embodiments, the target surface 106 may be a liquid crystal display, a photolithography mask, or another surface, including, but not limited to, surfaces involved in a semiconductor manufacturing process.

An array 102 of acoustic transducers 101 may include individual acoustic transducers 101. In one embodiment, the array 102 of acoustic transducers 101 may be coupled to a substrate 104. The substrate 104 may be comprised of substrate materials such as silicon, quartz, lithium niobate, silicon carbide, or other materials that are suitable for coupling acoustic transducers 101 to the substrate 104. In a further embodiment, the substrate 104 may comprise piezoelectric transducer materials. In such an embodiment, the substrate 104 may substantially comprise a lower frequency transducer for causing e.g., cavitation bubbles in the cleaning fluid 116.

The array 102 of acoustic transducers 101 may be coupled to the target surface 106 through a cleaning liquid 116. In some embodiments, the cleaning liquid 116 may be water. The water may be deionized, distilled, or purified by other means. In some embodiments, the cleaning liquid 116 may be a chemical solution.

Figure 2:
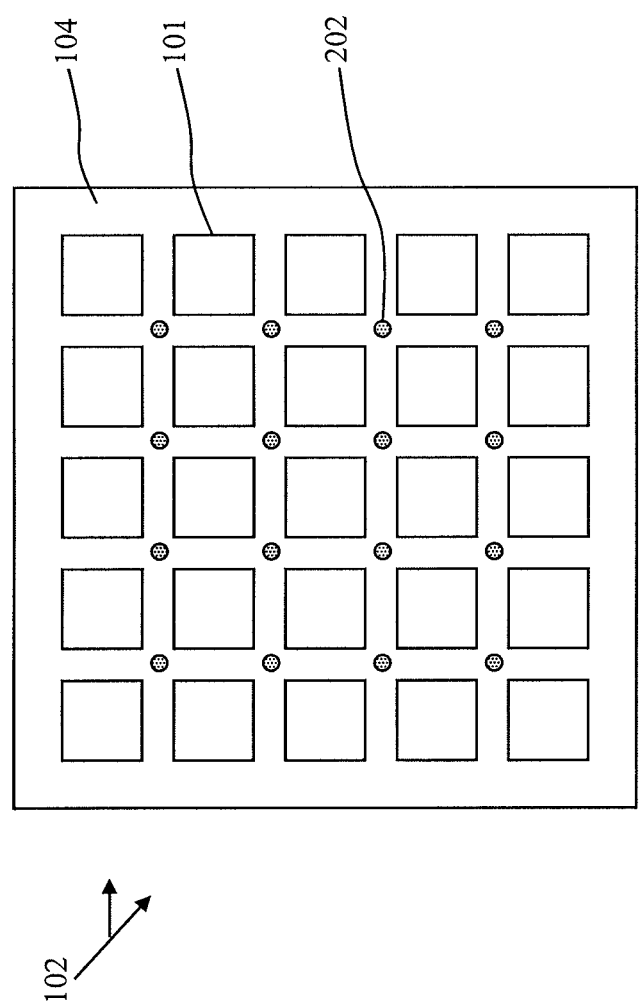
FIG. 2 is a schematic bottom view illustrating one embodiment of a gigasonic brush for cleaning surfaces.

In one embodiment, cleaning liquid supply 114 may dispense the cleaning liquid 116 into the tank 118. The array 102 of acoustic transducers 101 and the target surface 106 may be coupled to each other through the cleaning liquid 116 when they are immersed in the cleaning liquid 116 in the tank 118. In an alternate embodiment (not shown), the cleaning liquid 116 may be dispensed between the array 102 of acoustic transducers 101 and the target surface 106 by a spray configuration (not shown). As illustrated in FIG. 2, the cleaning liquid 116 may be dispensed from spray holes 202 contained in the substrate 104.

In one embodiment, acoustic waves 103 generated by the array 102 of acoustic transducers 101 may be absorbed by the cleaning liquid 116 as the acoustic waves 103 travel across a distance in the cleaning liquid 116. Because higher frequency acoustic waves may be absorbed by the cleaning liquid 116 faster than lower frequency acoustic waves, the application range may vary depending upon the frequency of the acoustic waves 103 being emitted from the array 102 of acoustic transducers 101. In certain embodiments of the system 100, the positioning mechanism 112 may adjust the position the array 102 of acoustic transducers 101 to within 1 millimeter of the target surface 106. In different embodiments, the positioning mechanism 112 may position the array 102 of acoustic transducers 101 at different distances from the target surface 106, within 1 millimeter, depending in part on the frequency or frequencies of the acoustic waves 103 being emitted and the rate at which the acoustic waves 103 dissipate in the cleaning liquid 116.

In some embodiments, a positioning mechanism 112 may be coupled either directly to at least one of the substrate 104 and the target surface 106, or indirectly to at least one of the substrate 104 and the target surface 106 through one or more coupling members (not shown). In a particular embodiment, the positioning regulator 110 is coupled to the positioning mechanism 112, and is configured to control the position of the array 102 of acoustic transducers 101 and/or the target surface 106 by moving the positioning mechanism 112. In alternative embodiments, a positioning mechanism 112 may be coupled to one of the substrate 104 and the target surface 106. In some alternative embodiments, a positioning mechanism 112 may be connected to the substrate 104 but not to the target surface 106. The target surface 106 may be in a static position during the positioning of the array 102 of acoustic transducers 101. In other embodiments, a positioning mechanism 112 may be coupled to the target surface 106 but not to the substrate 104. The array 102 of acoustic transducers 101 may be in a static position during the positioning of the target surface 106.

A positioning regulator 110 may include a machine or machines executable instructions. For example, a positioning regulator 110 may include a hardware circuit comprising custom VLSI circuits or gate arrays, off-the-shelf semiconductors such as logic chips, transistors, or other discrete components. A positioning regulator 110 may also include programmable hardware devices such as processors, special purpose microprocessors, field programmable gate arrays, programmable array logic, programmable logic devices or the like.

The positioning regulator 110 may also include software modules, which may include software-defined units or instructions, that when executed by a processing machine or device, transform data stored on a data storage device from a first state to a second state. An identified module of executable code may, for instance, comprise one or more physical or logical blocks of computer instructions which may be organized as an object, procedure, or function. Nevertheless, the executables of an identified module need not be physically located together, but may comprise disparate instructions stored in different locations which, when joined logically together, comprise the module, and when executed by the processor, achieve the stated data transformation.

In one embodiment, the system 100 includes a controller 120 that activates some or all of the acoustic transducers 101 in an array 102. The controller may send an activation signal or activation signals through a signal bus 122. An interface 124 on the substrate 104 may connect the signal bus 122 to the internal routing 126, which couples to the acoustic transducers 101 in the array 102. In some embodiments, the controller 120, signal bus 122, interface 124, and internal routing 126 may be configured to send a single activation signal to the entire array 102 of acoustic transducers 101. In other embodiments, the controller 120, signal bus 122, interface 124, and internal routing 126 may be configured to send separate activation signals to different individual acoustic transducers 101 and groups of individual acoustic transducers 101 within an array 102 of acoustic transducers 101 (see FIGS. 5-7). In further embodiments, the controller 120, signal bus 122, interface 124, and internal routing 126, may be configured to send separate activation signals to each individual acoustic transducers 101 within an array 102 of acoustic transducers 101. An activation signal may be the activation power that is required to activate one or more acoustic transducers, or an enabling signal for control circuitry (not shown) that may be built on the substrate 104 and that directs activating power to one or more of the acoustic transducers 101 in the array 102.

A controller 120 may include a machine or machines executable instructions. For example, a controller 120 may be implemented as a hardware circuit comprising custom VLSI circuits or gate arrays, off-the-shelf semiconductors such as logic chips, transistors, or other discrete components. A controller 120 may also be implemented in programmable hardware devices such as processors, special purpose microprocessors, field programmable gate arrays, programmable array logic, programmable logic devices or the like.

The controller 120 may also include software modules, which may include software-defined units or instructions, that when executed by a processing machine or device, transform data stored on a data storage device from a first state to a second state. An identified module of executable code may, for instance, comprise one or more physical or logical blocks of computer instructions which may be organized as an object, procedure, or function. Nevertheless, the executables of an identified module need not be physically located together, but may comprise disparate instructions stored in different locations which, when joined logically together, comprise the module, and when executed by the processor, achieve the stated data transformation. Further embodiments of the controller are described below with reference to FIG. 7.

FIG. 2 illustrates a bottom view of one embodiment where an array 102 of acoustic transducers 101 are coupled to a two-dimensional plane on a substrate 104. In some embodiments, the substrate 104 may include spray holes 202 configured to dispense cleaning liquid 116 into the gap between the array 102 of acoustic transducers 101 and the target surface 106. In some embodiments, the one or more spray holes 202 may be intermixed with the array 102 of acoustic transducers 101. In other embodiments, one or more spray holes 202 may be placed near the edge of the substrate 104 or in any place suitable for dispensing cleaning liquid 116 into an area between the array 102 of acoustic transducers 101 and the target cleaning surface 106.

Figure 3:
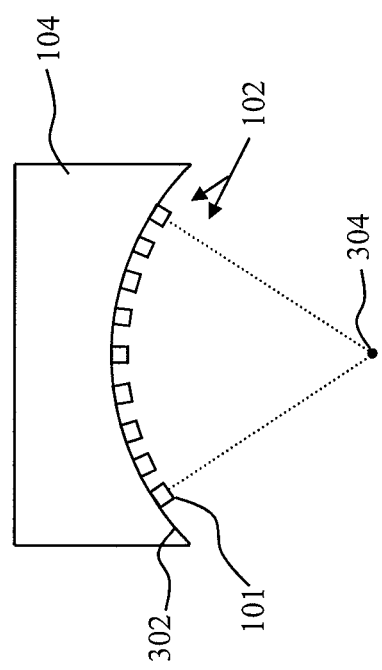
FIG. 3 is a schematic cross-section diagram illustrating another embodiment of a gigasonic brush for cleaning surfaces.

FIG. 3 illustrates a cross-section view of one embodiment where the substrate 104 has a concave surface 302. The array 102 of acoustic transducers 101 may be coupled to the concave surface 302, and acoustic waves 103 may be focused on a focus point 304. In other embodiments, the substrate 104 may contain multiple concave surfaces 302, and acoustic waves 103 may be focused on multiple focus points 304.

In some embodiments of the system 100, the positioning regulator 110 may control the positioning mechanism 112 to position the substrate 104, having one or more concave surfaces 302, relative to the target surface 106 in a manner which may align one or more focus points 304 with a desired location or locations on the target surface 106. In some embodiments, the positioning regulator 110 may control the position of the substrate 104 having one or more concave surfaces 302 and the position of the target surface 106 in such a manner that one or more focus points 304 are in a static position relative to the target surface 106 while the acoustic transducers 101 are active. In other embodiments, the positioning regulator 110 may control the position of the substrate 104 having one or more concave surface 302 and the position of the target surface 106 in such a manner that the focus point 304 moves relative to the target surface 106 while the acoustic transducers 101 are active.

Figure 4:
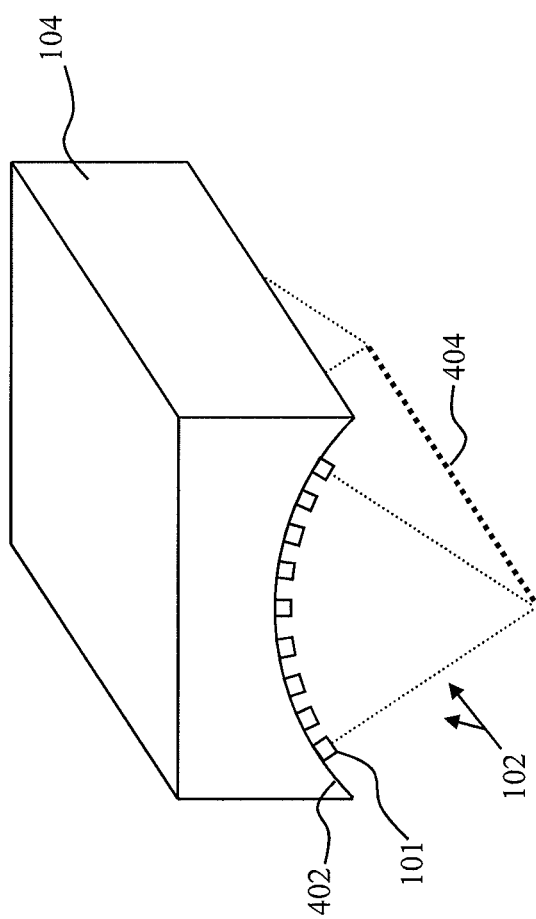
FIG. 4 is a three dimensional schematic cross-section diagram illustrating another embodiment of a gigasonic brush for cleaning surfaces.

FIG. 4 illustrates a cross-section view of one embodiment where the substrate 104 has a semi-cylindrical surface 402. The array 102 of acoustic transducers 101 may be coupled to the semi-cylindrical surface 402, and acoustic waves 103 may be focused on a focus line 404. In other embodiments, the substrate 104 may contain multiple semi-cylindrical surfaces 402, and acoustic waves 103 may be focused on multiple focus lines 404.

In some embodiments of the system 100, the positioning regulator 110 may control the positioning mechanism 112 to position a substrate 104, having one or more semi-cylindrical surfaces 402, relative to the target surface 106 in a manner which may align one or more focus lines 404 with a desired location or locations on the target surface 106. In some embodiments, the positioning regulator 110 may control the position of the substrate 104 having one or more semi-cylindrical surfaces 402 and/or the position of the target surface 106 in such a manner that one or more focus lines 404 are in a static position relative to the target surface 106 while the acoustic transducers 101 are active. In other embodiments, the positioning regulator 110 may control the position of the substrate 104 having one or more semi-cylindrical surfaces 402 and the position of the target surface 106 in such a manner that one or more focus lines 404 move relative to the target surface 106 while the acoustic transducers 101 are active.

Figure 5:
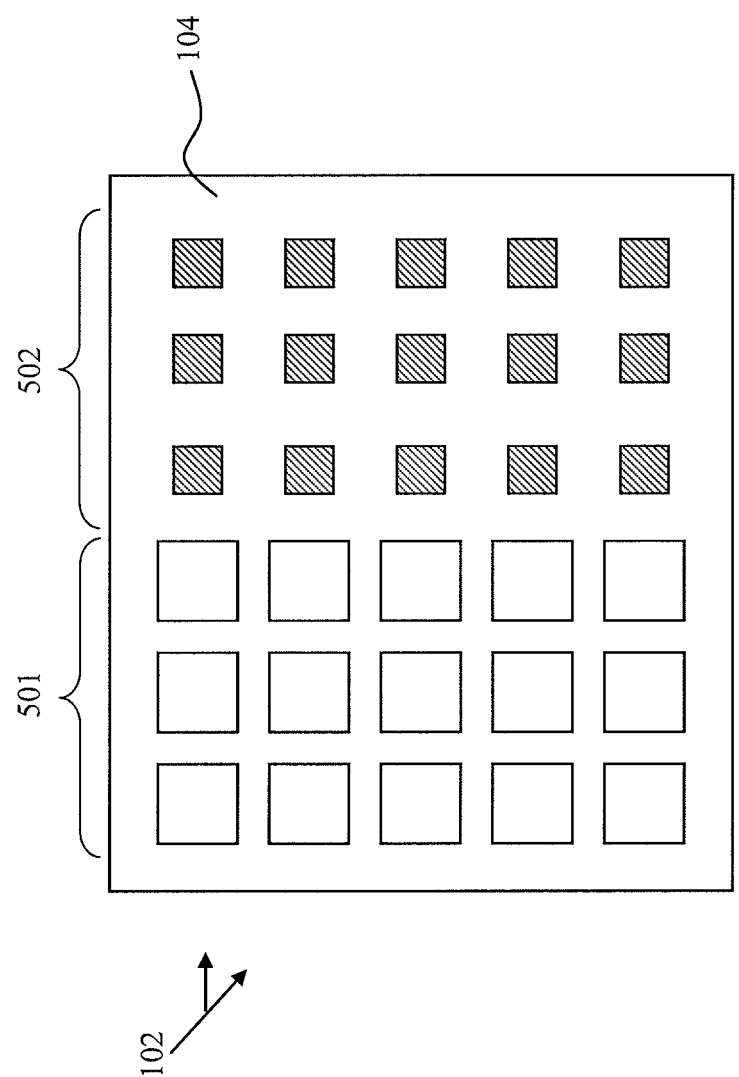
FIG. 5 is a schematic bottom view illustrating another embodiment of a gigasonic brush for cleaning surfaces.

FIG. 5 illustrates a bottom view of one embodiment of the array 102 of acoustic transducers 101 coupled to a substrate 104. The array 102 may comprise a first group 501 of acoustic transducers and a second group 502 of acoustic transducers. The first group 501 may be configured to operate at a first frequency, and the second group 502 may be configured to operate at a second frequency. In some embodiments, the first group 501 may have a first size, and the second group may have a second size. In some embodiments, the first group 501 comprise a first transducer material, and the second group 502 may comprise a second transducer material.

Figure 6:
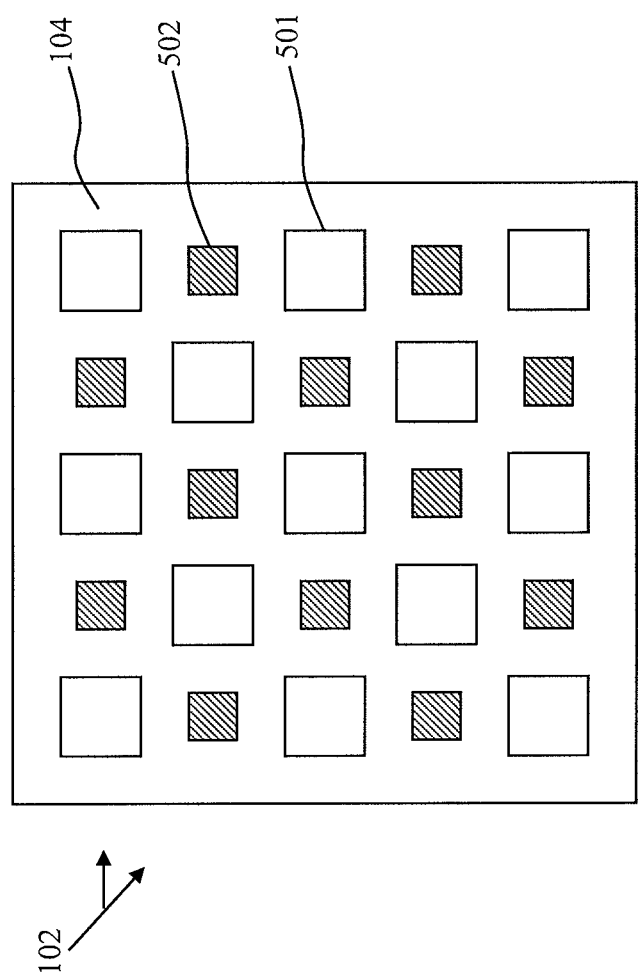
FIG. 6 is a schematic bottom view illustrating another embodiment of a gigasonic brush for cleaning surfaces.

FIG. 6 illustrates a bottom view of one embodiment where an array 102 of acoustic transducers 101 are coupled to a substrate 104. The array 102 may comprise a first group 501 of acoustic transducers 101 and a second group 502 of acoustic transducers 101. The first group 501 of acoustic transducers 101 and the second group 502 of acoustic transducers 101 may be intermixed.

Some target surfaces 106, including semiconductor wafers, may be sensitive to acoustic waves 103. In some situations, it may be desirable to limit the amount of acoustic energy applied to all or a portion of the target surface 106. In some other situations, it may be desirable to emit acoustic energy in the vicinity of some portions of the target surface 106 to clean those portions of the target surface, and to not emit acoustic energy in the vicinity of other portions of the target surface to avoid damage to sensitive patterns 726 on a target surface 106. Thus it may be desirable to activate one or more acoustic transducers 101 in the array 102 while selecting to not activate one or more of the other acoustic transducers 101 in the array 102.

Figure 7:
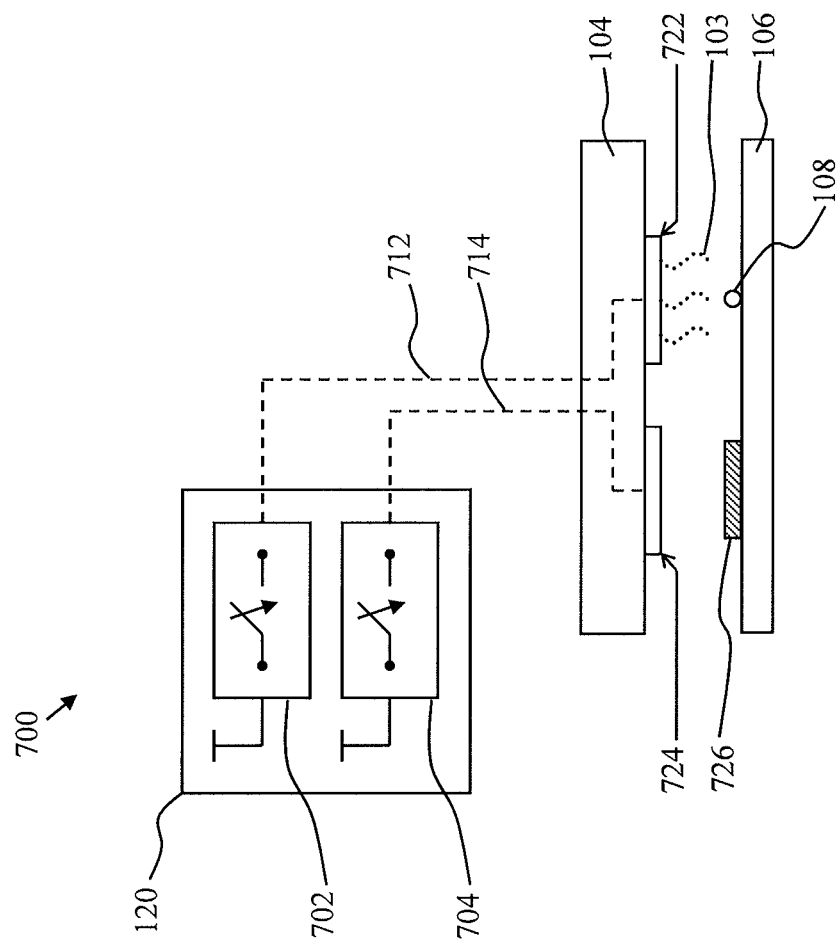
FIG. 7 is a schematic block diagram illustrating one embodiment of a system for selectively activating individual acoustic transducers in the gigasonic brush for cleaning surfaces.

FIG. 7 illustrates one embodiment of a system 700 that includes a controller 120 configured to selectively activate a first acoustic transducer 722 and selectively activate a second acoustic transducer 724. The controller 120 may comprise a first switch 702 and a second switch 704. The first switch 702 may be coupled to the first acoustic transducer 722 via a first signal line 712. The second switch 704 may be coupled to the second acoustic transducer 724 via a second signal line 714. In one embodiment, the controller 120 may select to turn on the first switch 702 to activate the first acoustic transducer 722, and select to turn off the second switch 704 to deactivate the second acoustic transducer 724 which may be aligned with a sensitive pattern 726 on the target surface 106.

In other embodiments, the controller 120 may select to deactivate the first acoustic transducer 722 and select to deactivate the first acoustic transducer 722, or the controller may select to activate both the first acoustic transducer 722 and the second acoustic transducer 724, or the controller may select to deactivate both the first acoustic transducer 722 and the second acoustic transducer 724.

Figure 8:
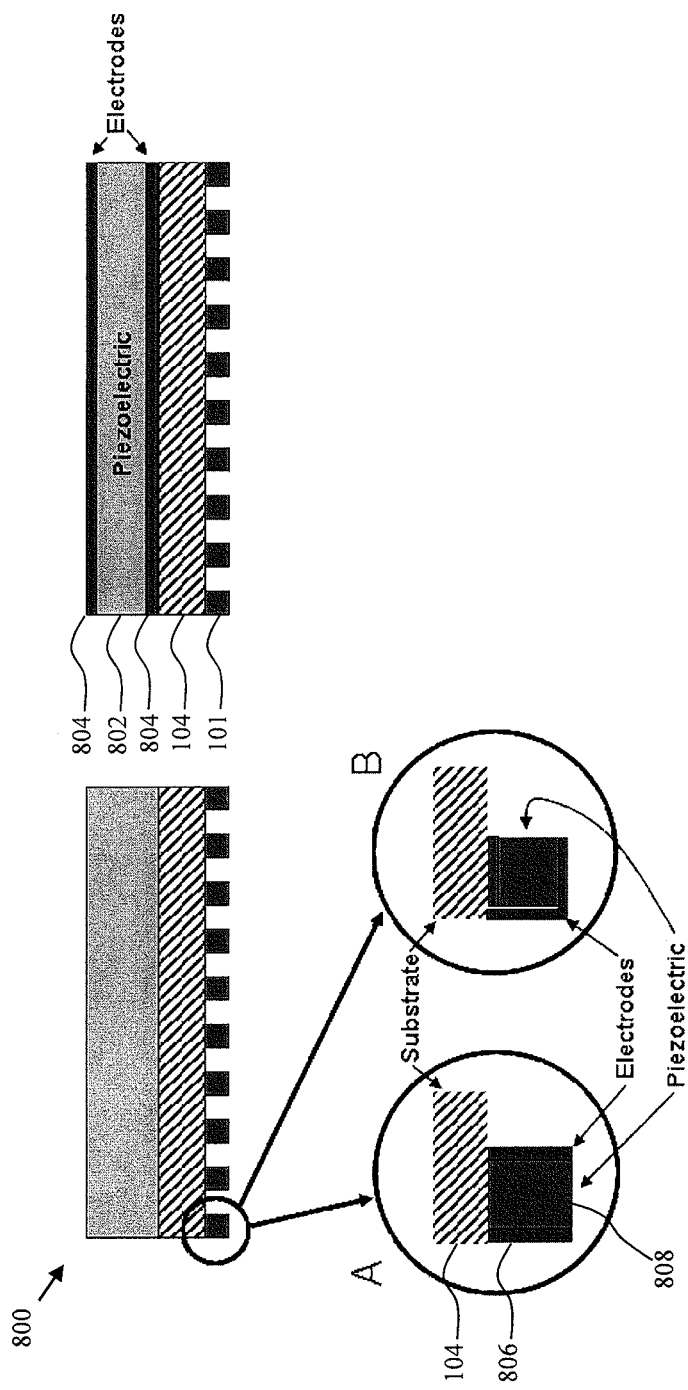
FIG. 8 is a schematic cross-section diagram illustrating one embodiment of a gigasonic brush for cleaning surfaces.

FIG. 8 illustrates one embodiment of a gigasonic brush 800 for cleaning a surface 106. In one embodiment, the gigasonic brush 800 may include a plurality of acoustic transducers 101. The acoustic transducers 101 may operate in the GHz range of frequencies. In such an embodiment, the acoustic transducers 101 may be coupled to a substrate 104. In configuration "A" of FIG. 10, the acoustic transducers 101 may include a Piezoelectric element 808 sized to emit sound waves having a frequency in the GHz range. The Piezoelectric element 808 may be coupled to a plurality of electrodes 806. In configuration "A" (lateral excitation configuration) the acoustic transducers 101 may emit transverse waves. In configuration "B" (vertical excitation configuration) the acoustic transducers 101 may emit longitudinal waves.

The Piezoelectric material may include lithium niobate and tantalate, zinc oxide, aluminium nitride, lead-zirconate-titanate and gallium arsenide, crystalline quartz, and the like. Some of these piezoelectrics are cut from a larger crystal, an example being the familiar quartz crystal shear-mode crystal employed in the quartz crystal microbalance (QCM). Films of these piezoelectrics are also important. They are produced by a variety of means, including: sputtering (from the pure element in a reactive chemical gas or from a compound source), pulsed laser deposition (ablation from a compound target upon which intense laser pulses are incident), chemical vapor deposition (CVD), spun-on polymeric piezoelectrics, and the solÈgel technique (spin-on deposition of chemical precursors in an organic binder that is later vaporized). Magnetic, electrostatic and thermal acoustic excitation means are also available.

In a further embodiment, an additional transducer configured to operate in the MHz frequency range may be coupled to the substrate 104. For example, the range may include 500 kHz to 10 MHz. For example, the transducer may include a Piezoelectric material 802 coupled to a plurality of electrodes 804. Piezoelectric material 802 may have a physical diameter of between 5 mm and 300 mm and a physical thickness of between 500 μm to 10 mm. In such an embodiment, the gigasonic brush 800 may emit both waves in the GHz range and the MHz range simultaneously, or substantially simultaneously.

Figure 9A:
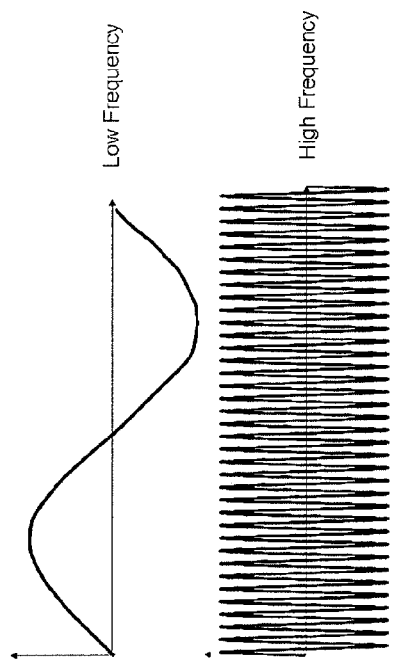
FIG. 9A is a plot diagram illustrating one embodiment of a low frequency pulse and a high frequency pulse.
Figure 9B:
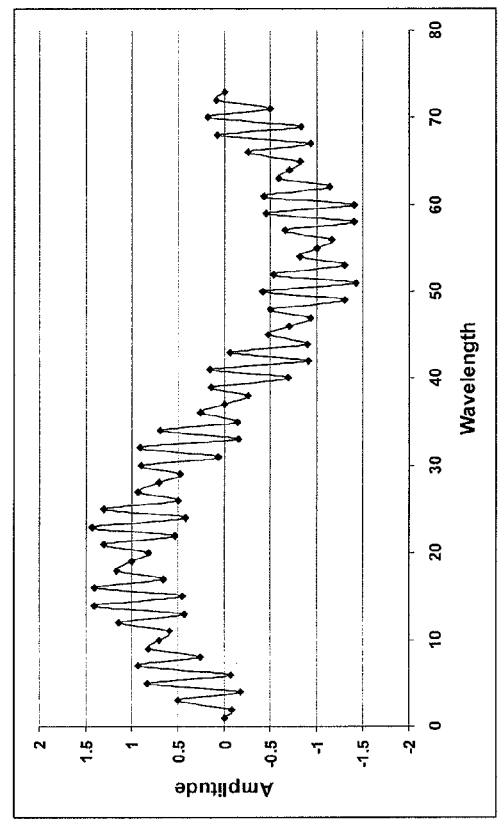
FIG. 9B is a plot diagram illustrating one embodiment of a high frequency pulse superimposed on a low frequency pulse.
Figure 9D:
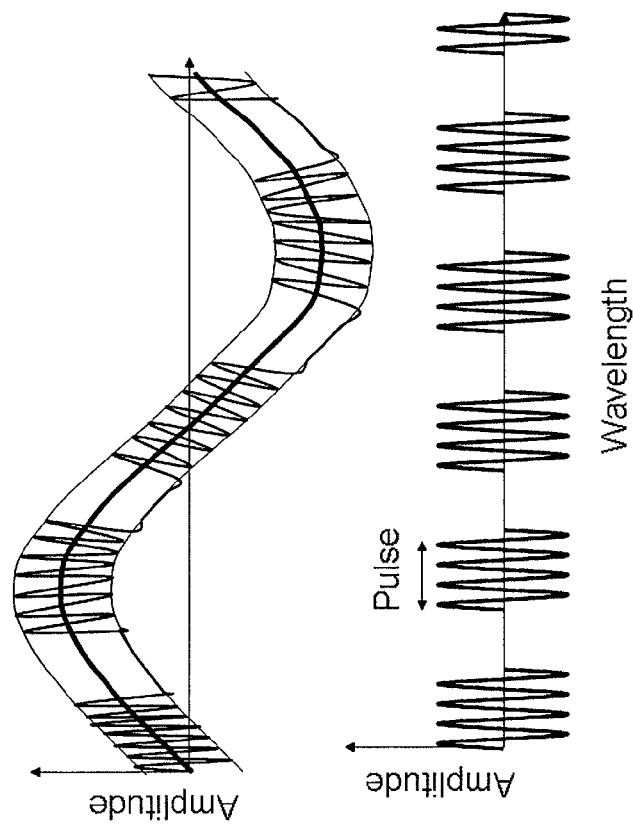
FIG. 9D is a plot diagram illustrating one embodiment of a pulsed high frequency signal superimposed on a low frequency signal.
Figure 9C:
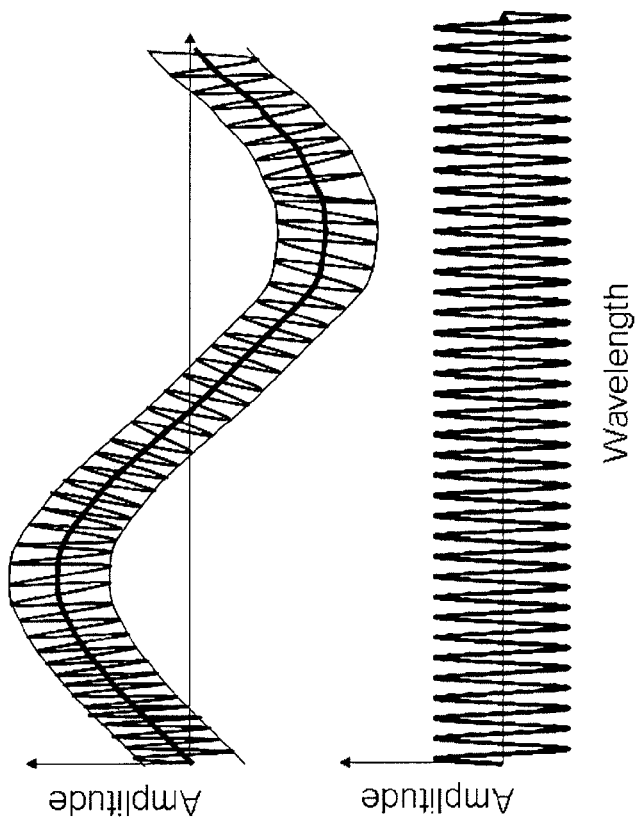
FIG. 9C is a plot diagram illustrating one embodiment of a high frequency signal superimposed on a low frequency signal.

For example, FIG. 9A illustrates a graph of a low frequency signal (i.e., a MHz frequency pulse) that may be generated by the larger Piezoelectric transducer 802 as well as a high frequency signal (i.e., a GHz frequency pulse) that may be generated by the acoustic transducer 101. As illustrated in FIG. 9B, when both the large transducer 802 and the acoustic transducer 101 are operated simultaneously, the resultant acoustic signal may include a high frequency wave superimposed on, or concatenated with, a low frequency wave as shown. Similarly, FIG. 9C illustrates a gigasonic signal superimposed on a lower frequency signal. For example, the lower frequency may be in the MegaHertz range or lower. FIG. 9D illustrates a gigasonic pulse superimposed on a lower frequency signal. In one embodiment, these types of superimposed signals may be achieved by powering, for example, the combine piezoelectric device described in FIG. 8.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 10:
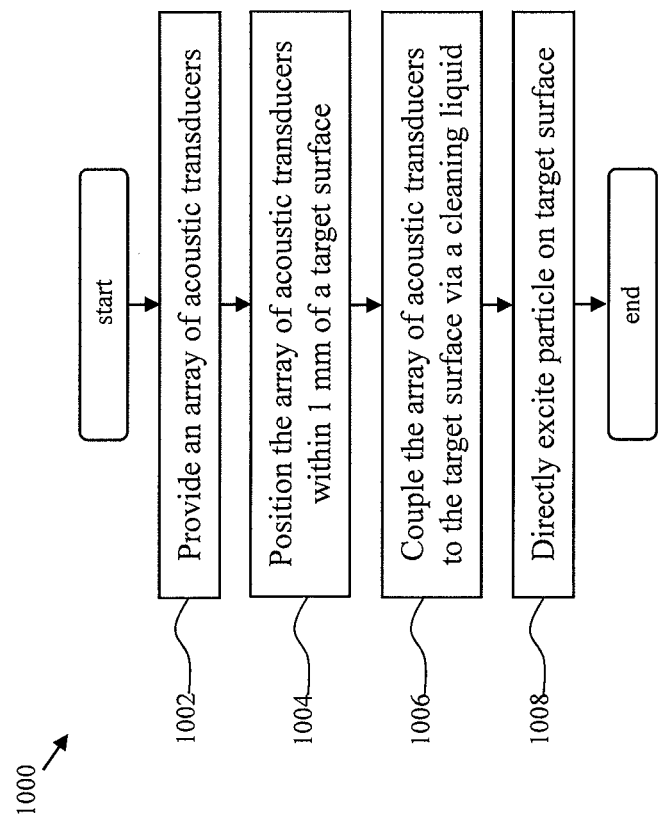
FIG. 10 is a schematic flow chart diagram illustrating one embodiment of a method for cleaning particles from a surface.

FIG. 10 illustrates one embodiment of a method 1000 for cleaning surfaces. In one embodiment, the method 1000 may include providing 1002 an array 102 of acoustic transducers 101 and positioning 1004 the array 102 of acoustic transducers 101 within 1 millimeter of a target surface 106. In some embodiments, the acoustic transducers 101 may have sizes in the range of 9 $\mu m^2$ to 250,000 $\mu m^2$. Additionally, the method 1000 may include coupling 1006 the array 102 of acoustic transducers 101 to the target surface 106 via a cleaning liquid 116, and directly exciting 1008 a particle 108 on the target surface 106. Some embodiments may directly excite 1008 a particle 108 having a diameter in the range of 1 nanometer to 500 nanometers on the target surface 106 with acoustic waves 103 at one or more frequencies in the range of 10 Megahertz to 10 Gigahertz from the array 102 of acoustic transducers 101.

In one example embodiment, the acoustic transducers 101 in the array 102 may have a size suitable to generate a sound wave having 1 GHz frequency. In the example embodiment, a positioning mechanism 112, coupled to the substrate 104 and the array 102 of acoustic transducers 101, may position the array 102 of acoustic transducers 101 at a predetermined distance from the target surface 106. The target surface 106 may be a semiconductor wafer. In the example embodiment, a cleaning liquid 116, comprised of deionized water and dispensed into a tank 118, may couple the array 102 of acoustic transducers 101 to the semiconductor wafer 106. A controller 120, may selectively activate acoustic transducers 101. The array 102 of acoustic transducers 101 may directly excite a particle 108, having a diameter in the range of 1 nm to 100 nm on the semiconductor wafer 106.

Some embodiments of method 1000 may further include coupling the array 102 of acoustic transducers 101 to a two dimensional plane. Some embodiments may include focusing the acoustic waves 103 from the array 102 of acoustic transducers 101 on a point 304. Some embodiments may further include focusing the acoustic waves 103 from the array 102 of acoustic transducers 101 on a line 404.

In certain embodiments of method 1000, providing 1002 an array 102 of acoustic transducers 101 may further include providing a first group 501 of acoustic transducers 101 configured to operate at a first frequency and providing a second group 502 of acoustic transducers 101 configured to operate at a second frequency. In some embodiments, the acoustic transducers 101 in the first group 501 and the acoustic transducers 101 in the second group 502 may have different sizes. In another embodiment, the acoustic transducers 101 in the first group 501 and the acoustic transducers in the second group 502 may comprise of different materials. In some embodiments, the acoustic transducers 101 in the first group 501 and the acoustic transducers 101 in the second group 502 may have different sizes and comprise of different materials.

In certain embodiments, the first group 501 of acoustic transducers 101 and the second group 502 of acoustic transducers 101 may be intermixed.

Some embodiments of method 1000 may further include selectively activating the first acoustic transducer 722 and selectively activating the second acoustic transducer 724. In some embodiments, the first acoustic transducer 722 may be aligned with a portion of the target surface 106 that is desired to be cleaned while the second acoustic transducer 724 may be aligned with a sensitive pattern 726. The first acoustic transducer 722 may be selected to be active and may clean a portion of the target surface. The second acoustic transducer 724 may be selected to not be active and may avoid emitting acoustic waves 103 in the vicinity of the sensitive pattern 726 on the target surface 106.

In some embodiments, the first acoustic transducer 722 may be selected to not be active, and the second acoustic transducer 724 may be selected to be active. In other embodiments, the first acoustic transducer 722 and the second acoustic transducer may both be selected to be active at the same time. In other embodiments, the first acoustic transducer 722 and the second acoustic transducer may both be selected to not be active at the same time.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A system comprising:
an array of acoustic transducers wherein individual acoustic transducers have sizes in the range of 9 square micrometers to 250,000 square micrometers;
a positioning mechanism coupled to at least one of a target surface and the array of acoustic transducers and configured to position the array of acoustic transducers within 1 millimeter of the target surface;
a cleaning liquid supply arranged to provide cleaning liquid for coupling the array of acoustic transducers to the target surface; and
a controller coupled to the array of acoustic transducers and configured to activate the array of acoustic transducers;
where the array of acoustic transducers is configured to directly excite a particle having a diameter in the range of 1 nanometer to 500 nanometers on the target surface with acoustic waves at one or more frequencies in the range of 10 Megahertz to 10 Gigahertz from the array of acoustic transducers.

2. The system of claim 1, further comprising a substrate having a concave surface, the array of acoustic transducers being coupled to the concave surface to focus the acoustic waves from the array of acoustic transducers on a point.

3. The system of claim 1, further comprising a substrate having a semi-cylindrical surface, the array of acoustic transducers being coupled to the semi-cylindrical surface to focus the acoustic waves from the array of acoustic transducers on a line.

4. The system of claim 1, the array of acoustic transducers being coupled to a two-dimensional plane on a substrate.

5. The system of claim 1, the array of acoustic transducers comprising a first group of acoustic transducers configured to operate at a first frequency and a second group of acoustic transducers configured to operate at a second frequency.

6. The system of claim 5, the first group of acoustic transducers and the second group of acoustic transducers being intermixed.

7. A system of claim 1, the controller further comprising:
a first switch coupled to a first acoustic transducer, and configured to selectively activate the first acoustic transducer; and
a second switch coupled to a second acoustic transducer, and configured to selectively activate the second acoustic transducer.

8. An apparatus comprising:
a substrate;
an array of acoustic transducers coupled to the substrate, the acoustic transducers having sizes in the range of 9 square micrometers to 250,000 square micrometers; and
a cleaning liquid supply arranged to provide a cleaning liquid to couple the array of acoustic transducers to a target surface;
where the array of acoustic transducers is configured to directly excite a particle having a diameter in the range of 1 nanometer to 500 nanometers on the target surface with acoustic waves at one or more frequencies in the range of 10 Megahertz to 10 Gigahertz from the array of acoustic transducers.

9. The apparatus of claim 8, the array of acoustic transducers comprising a first group of acoustic transducers configured to operate at a first frequency and a second group of acoustic transducers configured to operate at a second frequency.

10. The apparatus of claim 9, the first group of acoustic transducers and the second group of acoustic transducers being intermixed.

11. The apparatus of claim 8, further comprising a first acoustic transducer configured for selective activation and a second acoustic transducer configured for selective activation.

12. An apparatus comprising:
a low frequency acoustic transducer configured to operate within a first acoustic frequency range;
an array of high frequency acoustic transducers coupled to the low frequency acoustic transducer, the high frequency acoustic transducers having sizes in the range of 9 square micrometers to 250,000 square micrometers, the high frequency acoustic transducers configured to operate within a second acoustic frequency range, where the second acoustic frequency range is higher than the first acoustic frequency range and where the second acoustic frequency range is 10 MHz to 10 GHz; and a cleaning liquid supply arranged to provide a cleaning liquid to couple the array of acoustic transducers to a target surface;

where the array of high frequency acoustic transducers is configured to directly excite a particle having a diameter in the range of 1 nanometer to 500 nanometers on the target surface with acoustic waves at one or more frequencies in the second acoustic frequency range.

13. The apparatus of claim 12, wherein the first frequency range is 500 kHz to 10 MHz.

14. The apparatus of claim 12, wherein the low frequency transducer has a physical diameter of between 5 mm and 300 mm.

15. The apparatus of claim 12, wherein the low frequency transducer has a physical thickness of between 500 μm to 10 mm.

16. The apparatus of claim 12, wherein the array of high frequency acoustic transducers are coupled to the low frequency acoustic transducer such that the low frequency acoustic transducer is farther from the target surface than the array of high frequency acoustic transducers.

17. The apparatus of claim 12, wherein the array of high frequency acoustic transducers and the low frequency acoustic transducer are positioned such that a signal from the array of high frequency acoustic transducers is superimposed on a signal from the low frequency acoustic transducer.

18. The apparatus of claim 12, wherein the array of high frequency acoustic transducers and the low frequency acoustic transducer is each coupled a substrate.

19. The apparatus of claim 18, wherein the substrate is disposed between the array of high frequency acoustic transducers and the low frequency acoustic transducer.

20. The apparatus of claim 19, wherein the low frequency acoustic transducer is positioned farther from the target surface than the array of high frequency acoustic transducers.

* * * * *